United States Patent [19]
Beernink et al.

[11] Patent Number: 5,717,707
[45] Date of Patent: Feb. 10, 1998

[54] INDEX GUIDED SEMICONDUCTOR LASER DIODE WITH REDUCED SHUNT LEAKAGE CURRENTS

[75] Inventors: Kevin J. Beernink, Mountain View; David P. Bour, Cupertino; Thomas L. Paoli, Los Altos; Ross D. Bringans, Cupertino, all of Calif.; Gregory J. Kovacs, Mississauga, Canada

[73] Assignee: Xerox Corporation, Stamford, Conn.

[21] Appl. No.: 367,549

[22] Filed: Jan. 3, 1995

[51] Int. Cl.$^6$ ............................................. H01S 3/19
[52] U.S. Cl. ................................. 372/46; 372/45
[58] Field of Search ............................ 372/46, 45, 43, 372/50

[56] References Cited

U.S. PATENT DOCUMENTS

| | | | |
|---|---|---|---|
| 4,824,798 | 4/1989 | Burnham et al. | 437/81 |
| 4,870,652 | 9/1989 | Thornton | 372/50 |
| 4,881,235 | 11/1989 | Chinone et al. | 372/46 |
| 5,029,175 | 7/1991 | Ohnaka et al. | 372/46 |
| 5,469,457 | 11/1995 | Nagai et al. | 372/45 |

FOREIGN PATENT DOCUMENTS

| | | | |
|---|---|---|---|
| 57-69793 | 4/1982 | Japan | 372/45 |
| 61-251090 | 11/1986 | Japan | 372/45 |
| 3-283689 | 12/1991 | Japan | 372/45 |
| 6-97589 | 4/1994 | Japan | 372/50 |

OTHER PUBLICATIONS

R.L. Thornton, W.J. Mosby, and H.F. Chung, "Surface skimming buried heterostructure laser with applications to optoelectronic integration", Applied Physics Letters 59, 513 (1991).

M.J. Grove, D.A. Hudson, and P.S. Zory, "AlGaAs lasers fabricated with pulsed anodic oxides", paper DLPP3.2 at IEEE/LEOS 6th Annual Meeting, Nov. 1993, San Jose, CA.

F.A. Kish, S.J. Carracci, N. Holonyak, Jr., K.C. Hsieh, J.E. Baker, S.A. Maranowski, A.R. Sugg, J.M. Dallesasse, R.M. Fletcher, C.P. Kuo, T.D. Osentowski, and M.G. Craford, "Properties and use of $In_{0.5}(Al_xGa_{1-x})_{0.5}P$ and $Al_xGa_{1-x}As$ native oxides in heterostructure lasers", Journal of Electronic Materials 21, 1133 (1992).

O'Brien Appl. Phys. Lett. 53, 1859 (1988).

F.A. Kish, S.J. Caracci, N. Holonyak, Jr., J.M. Dallessasse, R.D. Burnham, And S.C. Smith, "Low threshold disorder-defined native-oxide delineated buried-heterostructure $Al_xGa_{1-x}As$–GaAs quantum well lasers," Appl. Phys. Lett. 58, 1765 (1991).

R.L. Thornton, R.D. Burnham, and T.L. Paoli, "Low threshold planar buried heterostructure lasers fabricated by impurity-induced disordering", Appl. Phys Lett 47, 1239 (1985).

*Primary Examiner*—Rodney B. Bovernick
*Assistant Examiner*—Yisun Song
*Attorney, Agent, or Firm*—Oliff & Berridge

[57] ABSTRACT

An index-guided semiconductor laser diode made by impurity-induced layer disordering (IILD) of AlInP, GaInP and AlGaInP heterostructures. Several techniques for reducing parasitic leakage current via the n-type IILD regions, are described. These include removing the upper portions of the material outside the laser stripe, which can be accomplished by wet or dry etching of the material in a self-aligned manner. As an alternative, after formation of the waveguide, appropriately doped layers are grown over the disordered and as-grown regions of the structure to contact the active waveguide and simultaneously block parasitic shunt current from the disordered regions. Another method provides shallow inset insulating regions to replace the n-type disordered regions at the vicinity of a cap layer used to reduce a current barrier.

25 Claims, 9 Drawing Sheets

INDEX GUIDED SEMICONDUCTOR LASER DIODE WITH REDUCED SHUNT LEAKAGE CURRENTS

The U.S. Government has certain rights in the invention as provided by the terms of Advanced Technology Program Award 70NANB2H1241 awarded by the Department of Commerce.

This invention relates to III-V heterostructures especially adapted to function as semiconductor lasers.

RELATED APPLICATIONS

A commonly-assigned application entitled "Improved Monolithic Array of Independently Addressable Diode Lasers", Ser. No. 08/049,898, now abandoned filed Apr. 20, 1993, in the name of Thomas L. Paoli (D/93084).

A commonly-assigned application entitled "INDEXED-GUIDED SEMICONDUCTOR LASER DIODE WITH SHALLOW SELECTIVE IILD", Ser. No. 08/345108, filed Nov. 28, 1994, in the names of Thomas L. Paoli, Robert L. Thornton and David P. Bour. (XRX-154)

BACKGROUND OF THE INVENTION

Selectively-buried ridge (SBR) waveguide structures to achieve index guided lasers fabricated by selective etching and regrowth of III-V material are known. Compared to the SBR lasers, IILD can be used to realize lasers with narrower width (for lower threshold and a more circular beam), lower distributed loss (for higher efficiency), and stronger lateral index guiding (for less astigmatism).

The basic IILD process relies on the in-diffusion of an impurity (silicon, germanium, zinc, etc.) which promotes intermixing of atoms on the group-III sublattice [1]. Bracketed numbers refer to patents/publications listed in the Appendix. The layers comprising a heterostructure can thus be intermixed into a homogeneous alloy whose composition is an average of the original layers. For example, a superlattice of 100 Å $Ga_{0.5}In_{0.5}P$/100 Å $Al_{0.5}In_{0.5}P$ will be intermixed to an alloy of $(Al_{0.5}Ga_{0.5})_{0.5}In_{0.5}P$. When a laser active layer is intermixed with adjacent cladding layers in this manner, the refractive index of the mixture is lower than that of the original active layer. Consequently, a lateral waveguide can be formed by IILD. Similarly, the intermixed layers also have higher bandgap energy, resulting in the lateral confinement of injected carriers in a laser stripe. These attributes of IILD make it a desirable technique for the fabrication of high performance index-guided laser diodes.

A standard index-guided AlGaAs laser diode 10 fabricated by impurity-induced-layer-disordering (IILD) is shown in FIG. 1. Selective silicon diffusion from a solid, arsenic-doped silicon film induces intermixing of the quantum well (QW) heterostructure active layer 11 with the carrier confinement layers 11a, 11b. The intermixed regions 12, 13 flanking the active layer 11 consequently have a higher bandgap energy and lower refractive index than the as-grown quantum well. However, the resultant high silicon doping ($[Si] \sim 10^{19}$ cm$^{-3}$) also yields a high electron concentration in the intermixed regions 12, 13. Therefore, to prevent current from shunting through the intermixed regions when voltage is applied across the top 20 and bottom 21 contacts, and around the active (unintermixed) stripe 19, a shallow zinc diffusion 15 has been used to create a p-n junction 16 in the high-bandgap, upper cladding layer 17. Thus, current is injected only into the unintermixed stripe region 19, and the surrounding intermixed regions 12, 13 provide very strong lateral confinement of both the optical mode and the injected carriers. In this way, the confinement offered by the IILD buried heterostructure can be superior to that offered by other laser diode structures.

Although the IILD process has been perfected for the AlGaAs materials system, its application to the AlGaInP materials system is not straightforward. In particular, p-doping is more difficult in AlGaInP. Indeed, it has so far proven impossible to p-dope $Al_{0.5}In_{0.5}P$ at a level of p=1× $10^{18}$ cm$^{-3}$ with zinc by diffusion. In comparison, the silicon n-doping required for IILD is considerably higher than the maximum p-doping available from zinc. Therefore, the zinc diffusion used after IILD of AlGaAs heterostructures, required to block shunt-current paths, is not particularly effective in AlGaInP.

From another aspect, multiple laser sources are needed in certain laser printers. See, for example, the discussion in U.S. Pat. No. 4,870,652. Compatibility with current and future photoreceptors requires that these multiple laser sources be fabricated in layers of AlInP, GaInP, or their combinations. Following previous work in AlGaAs materials, we believe that impurity-induced layer disordering is a preferred way to define independently addressable closely spaced lasers. However, the straightforward extension of the AlGaAs layer disordering technology to the AlGaInP material system has encountered significant obstacles which thus far have prevented development of a workable process for forming a buried heterostructure laser.

BRIEF SUMMARY OF INVENTION

An object of the invention is an improved index-guided III-V semiconductor laser.

A further object of the invention is an improved index-guided laser fabricated in AlInP or GaInP or AlGaInP.

Another object of the invention is an index-guided semiconductor laser fabricated by IILD and exhibiting reduced leakage current.

Still a further object of the invention is an index-guided semiconductor laser fabricated by IILD and which will not need a type conversion to reduce shunt leakage current.

In accordance with one aspect of the present invention, an index-guided laser diode in the phosphorus or P-containing material system is fabricated by IILD applied to a planar structure containing a cap layer for reduced contact resistance. The higher n-type doping resulting from the IILD will normally produce a shunt junction at the edges of the undiffused cap portion overlying the stripe region. No p+ diffusion is used to overdope the converted IILD regions surrounding the undiffused cap portion. The shunt junction thus formed is removed in accordance with the present invention by various techniques to reduce the leakage currents.

Briefly summarizing, the techniques to reduce leakage current comprise:

A. Direct elimination of the current leakage after IILD. This includes isolation of the shunt region with ion bombardment or oxidation to form an insulating region. Variants include the addition of a III-V material overgrowth of the insulating region and cap layer.

B. Removal of the shunt region by etching after IILD. Variants include the addition of an insulating region, and/or the addition of a III-V material blanket or selective overgrowth to form an isolation layer or a junction layer.

C. Planar overgrowth without removal of the shunt region after IILD to control or eliminate the leakage path. Combinations of the various techniques are also deemed within the scope of our invention.

In a first preferred embodiment of the invention, a shallow surface oxidation step is performed while masking the undiffused cap portion. The oxidation is extended down to at least the interface of the cap layer with the underlying cladding layer. This process results in replacing the regions forming shunt junctions with inset insulating material eliminating a potential source of leakage currents. An alternate process is to use proton implantation to form a high-resistance or insulating region corresponding to the inset oxide.

In a second preferred embodiment of the invention a layer of p-type III-V material is grown over the surface of the structure resulting after the ILD step. The p-type material isolates the converted n-type regions and prevents their functioning as a shunt for leakage current.

In a third preferred embodiment of the invention a shallow surface region surrounding the undiffused cap portion is removed down to the interface of the cap portion with the underlying cladding or other layers, thus removing the shunt junction between the undiffused cap and the diffused regions.

Each of the methods described herein offers its own special advantages and benefits. The choice would depend on a number of factors which will be discussed below during the detailed description that follows.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

DETAILED DESCRIPTION OF PREFERRED EMBODIMENTS

Figure 1:
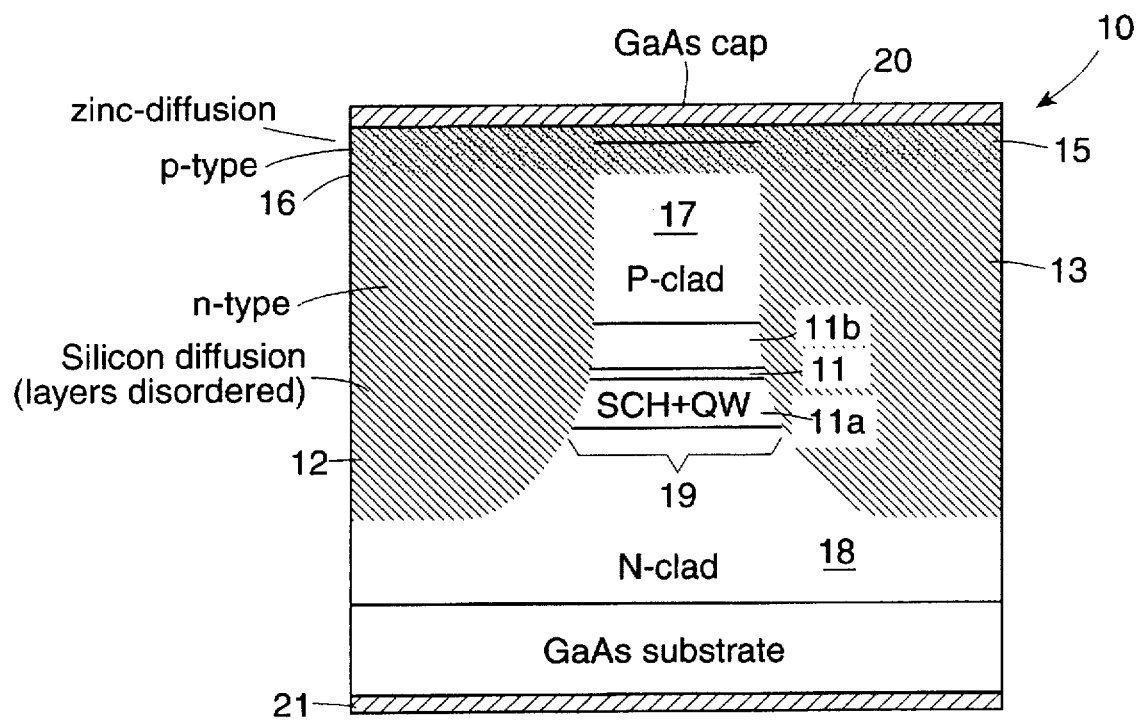
FIG. 1 is a cross-section of a typical index-guided AlGaAs laser diode fabricated by ILD.
Figure 2A:
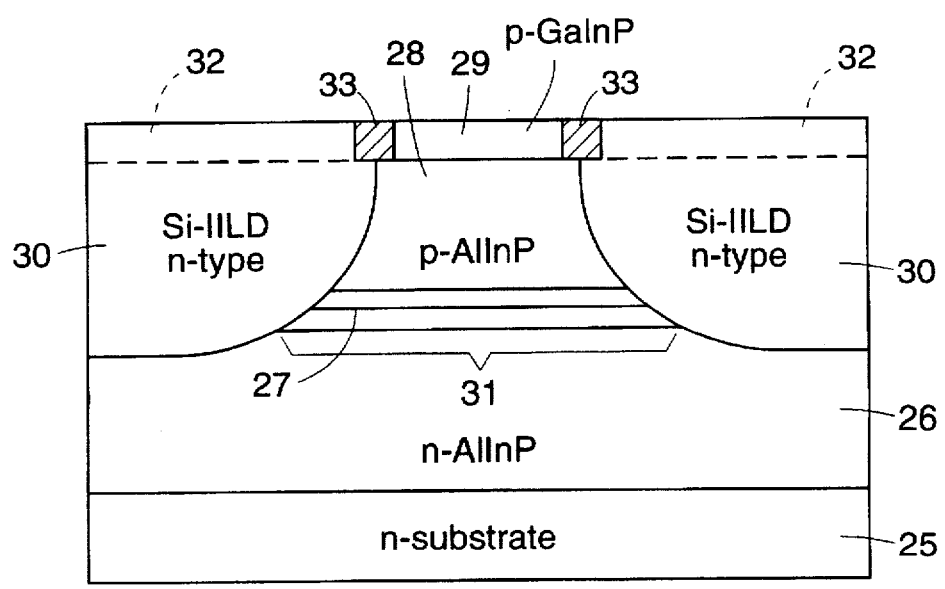
FIGS. 2A and 2B are schematic cross-sections of one form of index guided diode fabricated by ILD in accordance with the invention, shown at earlier and later phases, respectively, during the manufacture.
Figure 2B:
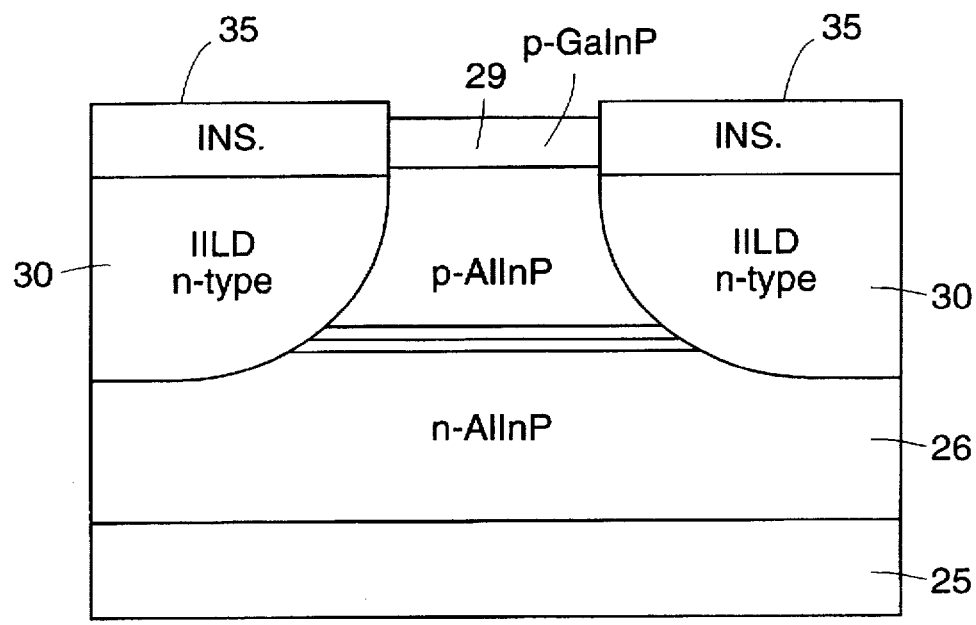

In the preferred embodiments according to this invention, we describe structures which address the following problematic features of the AlInP, GaInP and AlGaInP materials systems, thus enabling ILD to be applied to visible laser diodes. FIG. 2A illustrates a problem encountered in the fabrication of a AlInP laser diode by ILD. On an n-substrate 25 of GaAs are epitaxially grown by well-known MBE or MOCVD processes a lower cladding layer 26 of n-AlInP, an active region sandwich 27 of AlGaInP confining and GaInP active layers, an upper cladding layer 28 of p-AlInP, and a contact layer 29 of p-GaInP. Subsequently, a center stripe of the contact layer 29 is masked (not shown), and Si in-diffused to form flanking ILD wing regions 30 on opposite sides of a center stripe region 31. The diffused Si converts the regions 30 of the planar structure into n-type material, including the original side portions 32 of the contact cap layer 29. Because the cap layer 29, 32 of the planar structure was intact prior to the ILD step, a junction region 33 (shown hatched) is formed at the edges of the undiffused cap layer 29. These junction regions 33 undesirably shunt current away from the active stripe region 31. One solution to this problem is to provide a non-conducting or insulating region between the p-type GaInP cap and the n-type ILD converted regions, by converting the surface surrounding the cap 29 using the same mask used for the Si diffusion to form insulating regions 35 (FIG. 2B) which border the cap layer 29.

Figure 3A:
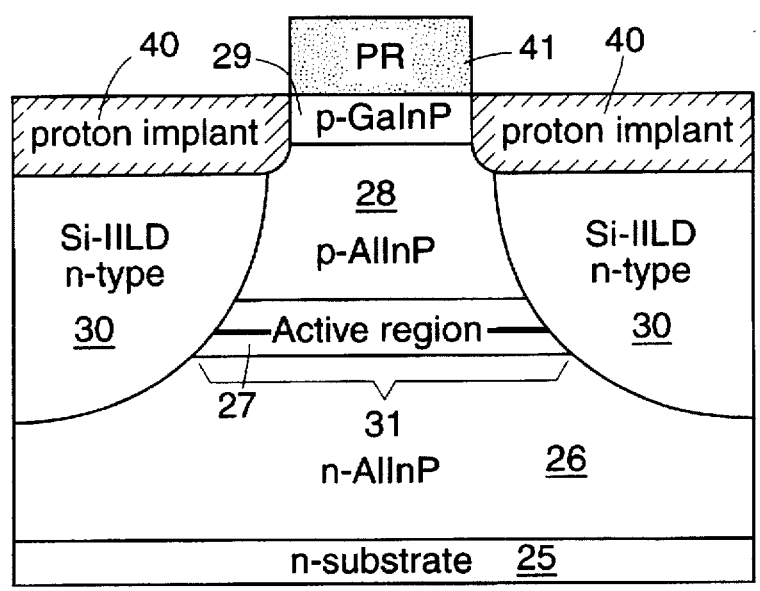
FIGS. 3A and 3B are partial cross-sections illustrating improved AlInP laser diodes at certain times during their fabrication and at their completion, respectively, in accordance with the invention.

One method of rendering the material 35 insulating is by ion implantation, as illustrated at 40 in FIG. 3A for an AlGaInP buried heterostructure laser defined by impurity-induced layer disordering. In this case, the regions outside the stripe 31 defined by diffusion are subjected to ion bombardment 40 while the stripe itself is protected by a photoresist mask 41. By using a mask width that is slightly narrower than the stripe 31, the lateral shunt junctions at the top of the structure can be completely removed. Any species that would render the material insulating is suitable for the implant. Examples are oxygen and helium.

Figure 3B:
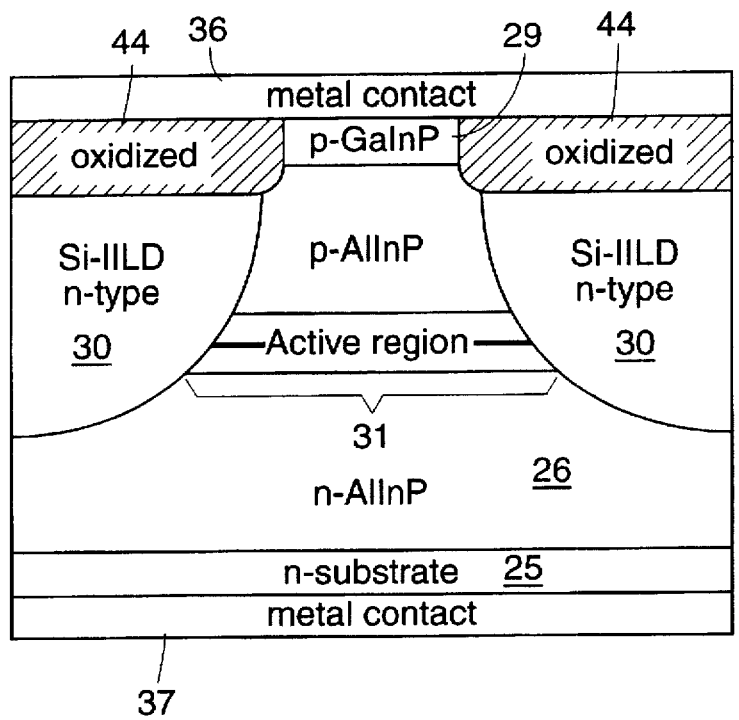

Another way to render the material insulating is to oxidize the top few thousand Å, as shown in FIG. 3B. In this case, a mask (not shown) somewhat wider than the stripe 31 is used, since the oxidation 44 will undercut the mask. The shallow oxidation could be accomplished by subjecting the surface to water vapor in an oven heated to about 550° C. for several hours [3], or by the process of anodic oxidation in the proper electrolytic solution [2].

FIG. 3B shows the device in a final state in which, after the oxidation, the photoresist 41 is removed and contact metals 36, 37 are deposited at the top and bottom of the structure. The body is then cleaved at opposite ends to form the usual mirrored surfaces. FIG. 3A shows an intermediate stage illustrating proton implantation with the photoresist mask 41 in place.

Figure 4A:
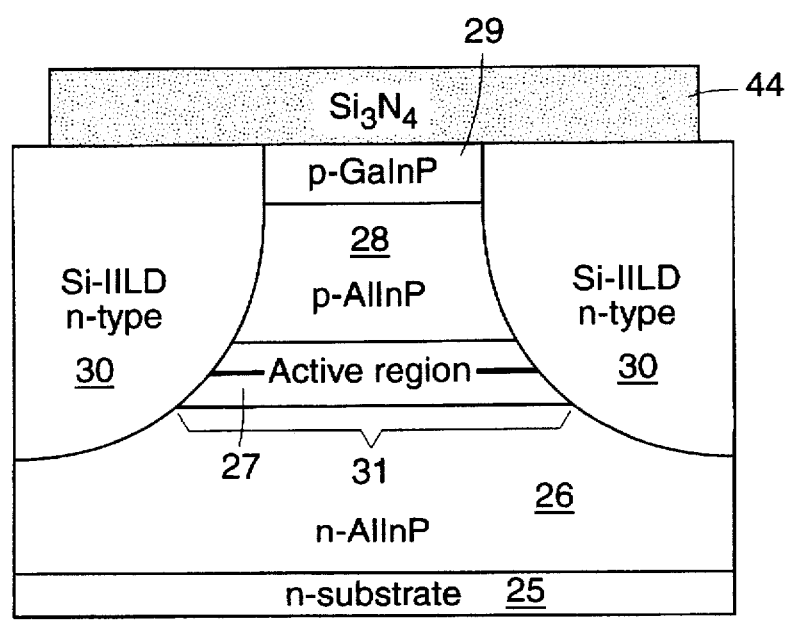
FIGS. 4A and 4B are partial schematic cross-sections similar to FIGS. 3A and 3B respectively of other improved laser diodes according to the invention.
Figure 4B:
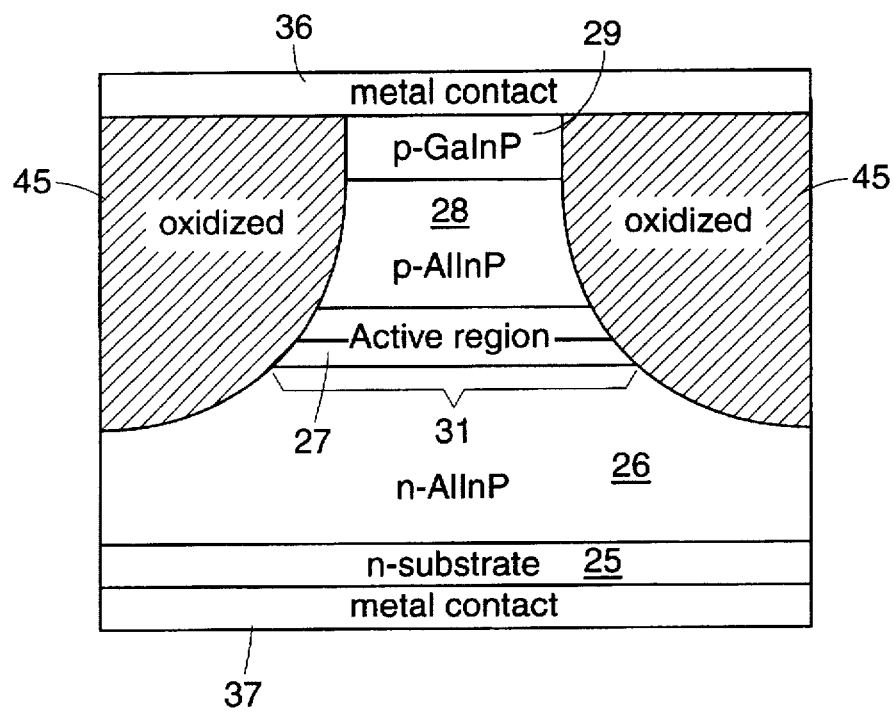

The need for aligning a mask to the stripe 31 in the FIG. 3B embodiment can be eliminated if the material is oxidized to a greater depth using the same mask used to pattern the ILD. This is illustrated in FIGS. 4A and 4B where FIG. 4A shows the device after the ILD with the ILD mask 44 in place for the deep oxidation to follow, while FIG. 4B shows the device after oxidation 45 and the contacts 36, 37 added. To finish the device pictured in FIG. 4B, end surfaces of the body are cleaved to form the conventional mirrors.

Another solution according to the invention involves overgrowing appropriately doped layers after the laser's buried optical waveguide is formed by IILD. The advantages of this approach are as follows:

1. As in the other embodiments, compensation of n-type impurities in an AlGaInP layer with high Al content by a Zn diffusion is not required.

2. The properties of the overgrown layers can be optimized independently of the diffusion process during or after MOCVD or MBE growth.

3. The structure of the overgrown layers can be designed to eliminate the unwanted parasitic leakage currents.

4. The source for the layer disordering can be placed as close to the active layer as desired. This is of considerable importance since the diffusion disordering of AlGaInP materials is relatively slow.

Figure 5A:
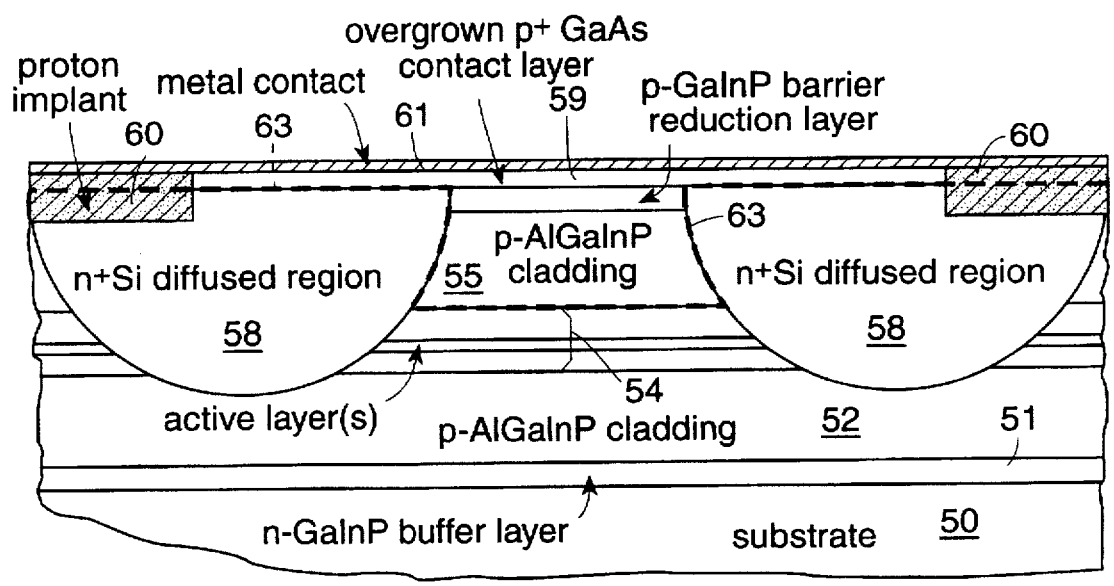
FIGS. 5A and 5B are schematic cross-sections of further laser diodes formed according to the invention.

FIG. 5A illustrates the principle of this invention in its simplest form. On a substrate 50 is epitaxially grown an n-GaInP buffer layer 51 (desirable but not essential), and n-AlGaInP lower cladding 52. A separate confinement-active layer structure 54 is grown from layers of AlGaInP with appropriate compositions up to and including upper cladding 55 and a p-type GaInP barrier reduction layer 56. A preferred embodiment is to use AlInP claddings, but for generality this embodiment uses quaternary claddings. The optical waveguide is then formed by coating the entire wafer surface with $Si_3N_4$, opening windows in the nitride where the layer disordering is desired, depositing silicon doped with phosphorus over the nitride and openings, and then capping the silicon layer with another layer of $Si_3N_4$. After appropriate annealing of the encapsulated wafer to form the intermixed regions 58 shown in FIG. 5A, the layers of nitride and silicon are removed and a layer of heavily doped p-type GaAs 59 is epitaxially grown on the exposed surface. Proton implantation 60 is applied outside of the diffused/disordered regions 58 to isolate the laser from the remainder of the chip and a metal contact 61 is applied. The isolation is important when plural side-by-side lasers are built into a common wafer to form an array.

Although this structure is attractive due to its simplicity, it has an undesirable leakage path around the active waveguide. The heavy broken line 63 in FIG. 5A outlines the potentially active p-n junction in this device. The junction between the p-AlGaInP cladding 55 and the n-diffused regions 58 is not expected to conduct forward current when the laser is operated since injection into the active layer will occur at a lower voltage. However, the p-GaInP/n-diffused heterojunction may leak current since its turn-on voltage will be similar to or lower than the active layer. To minimize this leakage, the p-GaInP barrier reduction layers 56 should be only as thick as needed to reduce the operating voltage in the conduction channel. Similarly, the p-GaAs 59/n-diffused 58 heterojunction also has a low turn-on voltage. However, because of the high Al composition of the disordered regions 58, the native oxide formed on its surface may provide intrinsic isolation in this region. Alternatively, the native oxide can be thickened to provide additional isolation.

Figure 5B:
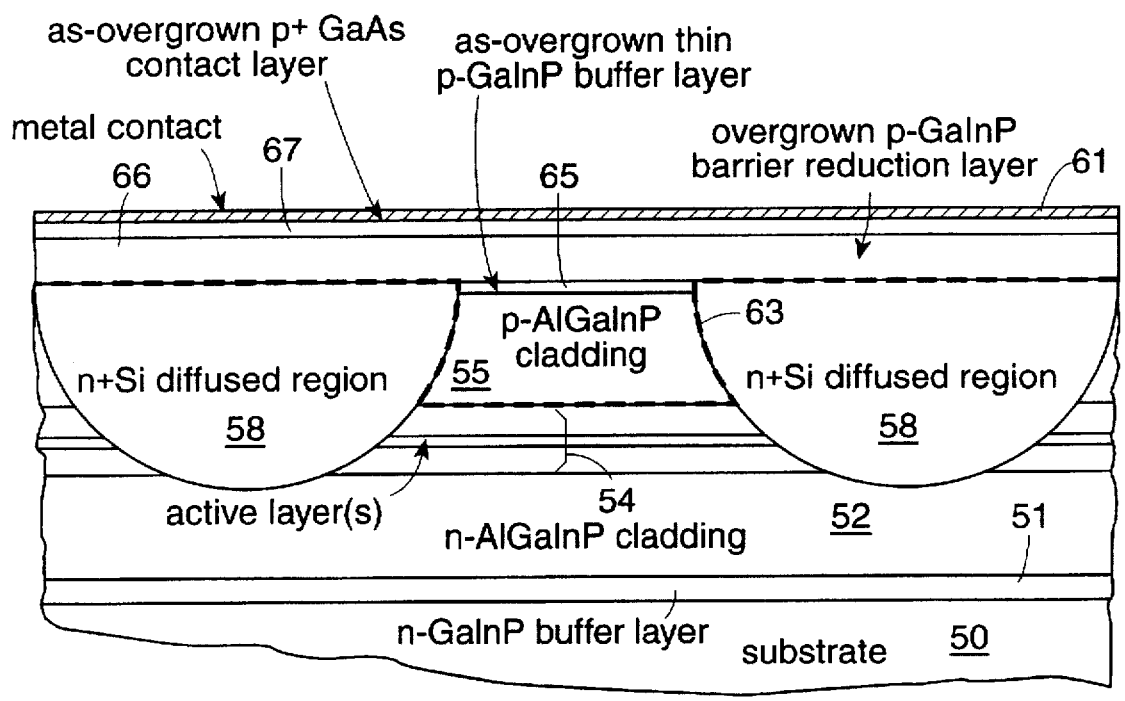

For a structure in which the native oxide or an enhanced oxide provides adequate blockage of the leakage current through the disordered regions 58 from the contact layer, the remaining leakage through the p-GaInP 56 into the disordered regions 58 can be minimized by thinning the P-GaInP layer 56 to less than 10 nm, e.g., 4 to 5 nm. The p-GaInP layer then becomes a buffer layer whose main purpose is to protect the underlying AlGaInP 55 in the conductive channel. To provide a low channel resistance with such a thin p-GaInP layer, a thick p-GaInP barrier reduction layer 66 and p-GaAs contact layer 67 are grown over the structure as shown in FIG. 5B. As in the embodiment of FIG. 5A, proton implantation 60 is applied outside of the diffused/disordered regions 58 to isolate the laser from the remainder of the chip and the native oxide may provide isolation between the p-GaInP 66 and the disordered regions 58.

Figure 6:
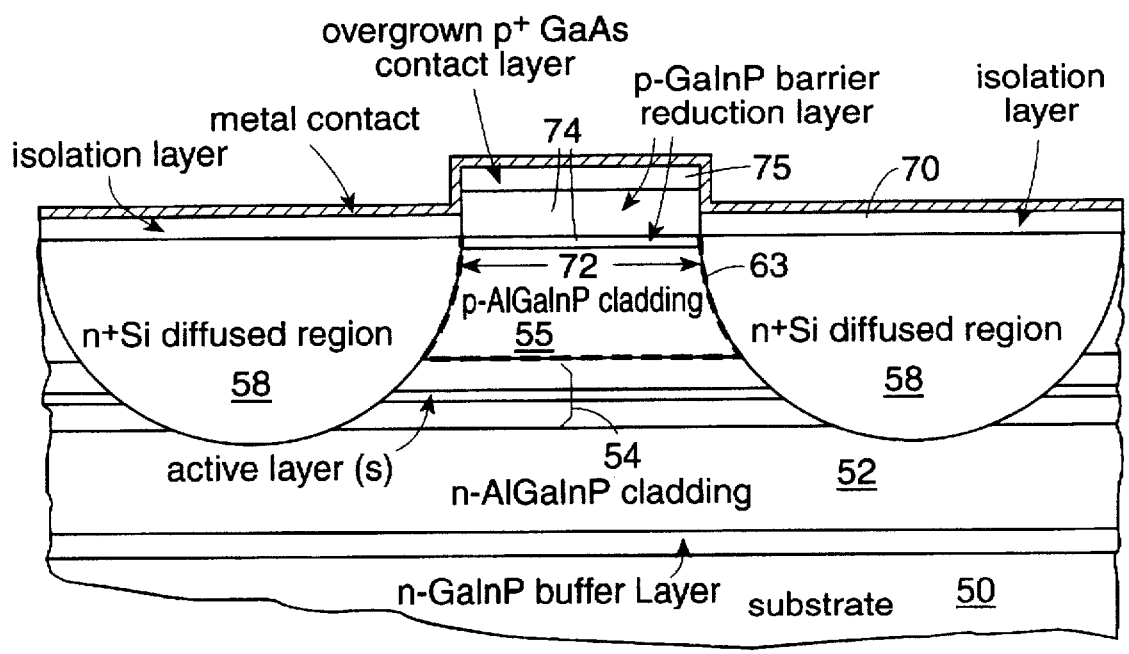
FIG. 6 is a schematic cross-section of a laser diode formed according to the invention in an intermediate stage.

FIG. 6 shows an embodiment in which leakage from the contact through the disordered regions 58 is blocked by a dielectric isolation layer 70. An advantage of this design is that it can produce a self-aligned conductive channel 72 by using the $Si_3N_4$ layer deposited over the disordered regions for the blocking layer. This self-alignment is accomplished by spinning photoresist on the wafer before removal of any $Si_3N_4$ after the IILD anneal. The photoresist (not shown) planarizes the wafer surface with the top of the $Si_3N_4$ masking stripes revealed. Then after a blanket exposure of the photoresist, the $Si_3N_4/Si/Si_3N_4$ layers can be removed from above the conductive channel 72 without affecting the $Si_3N_4$ above the disordered regions. After removal of the photoresist, a p-GaInP barrier reduction layer 74 followed by a p-GaAs contact layer 75 are grown in this opening to contact the current channel as shown in FIG. 6.

Figure 7:
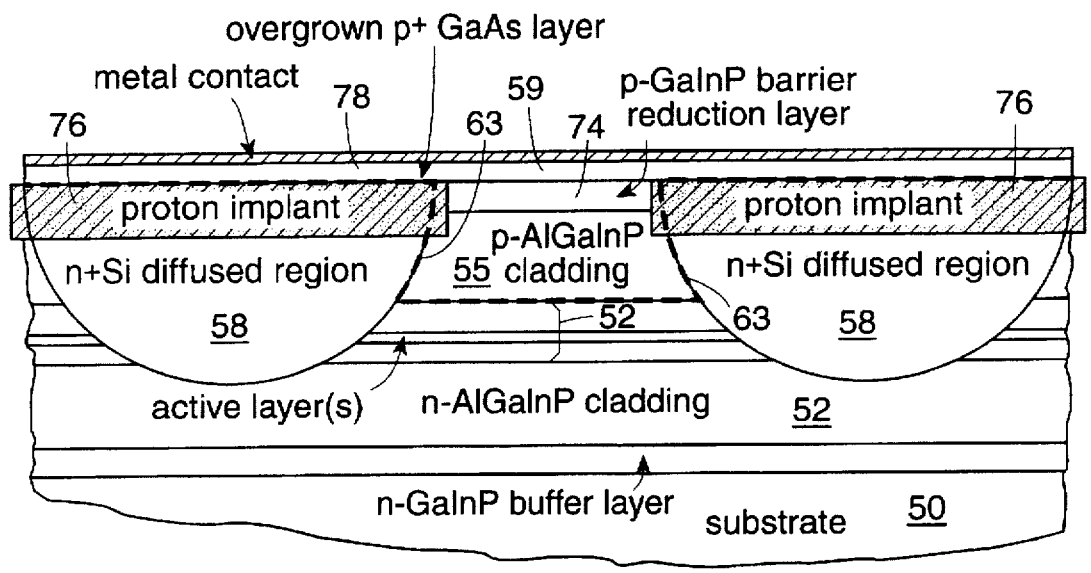
FIG. 7 is a schematic cross-section of a laser diode formed according to the invention.

FIG. 7 shows an embodiment designed to eliminate leakage through the junction between the p-GaInP 74 and the disordered regions 58. After the optical waveguide has been formed by the silicon diffusion, the $Si_3N_4/Si/Si_3N_4$ layers are removed and a mask is applied to enable proton implantation as shown by the cross-hatched regions 76 of FIG. 7. Alignment of the mask can be facilitated by lightly pre-etching the surface with an Al or n-doping selective etch to produce a slight relief of the undisordered stripe. Following proton bombardment, the p+ GaAs contact layer 78 is grown over the surface. The proton implanted material is highly resistive and thereby blocks leakage through the heterojunction formed by the disordered regions 58 with the p-GaInP barrier reduction layer 74 as well as through the overgrown GaAs layer 78. Alternatively, the proton implant can be performed after growth of the p-GaAs contact layer. One advantage of proton implantation after regrowth is less interaction with the surface of the GaInP layer 74 in the conductive channel. Protons can also be implanted either before or after regrowth to block any residual leakage in the structure of FIG. 5B.

Figure 8:
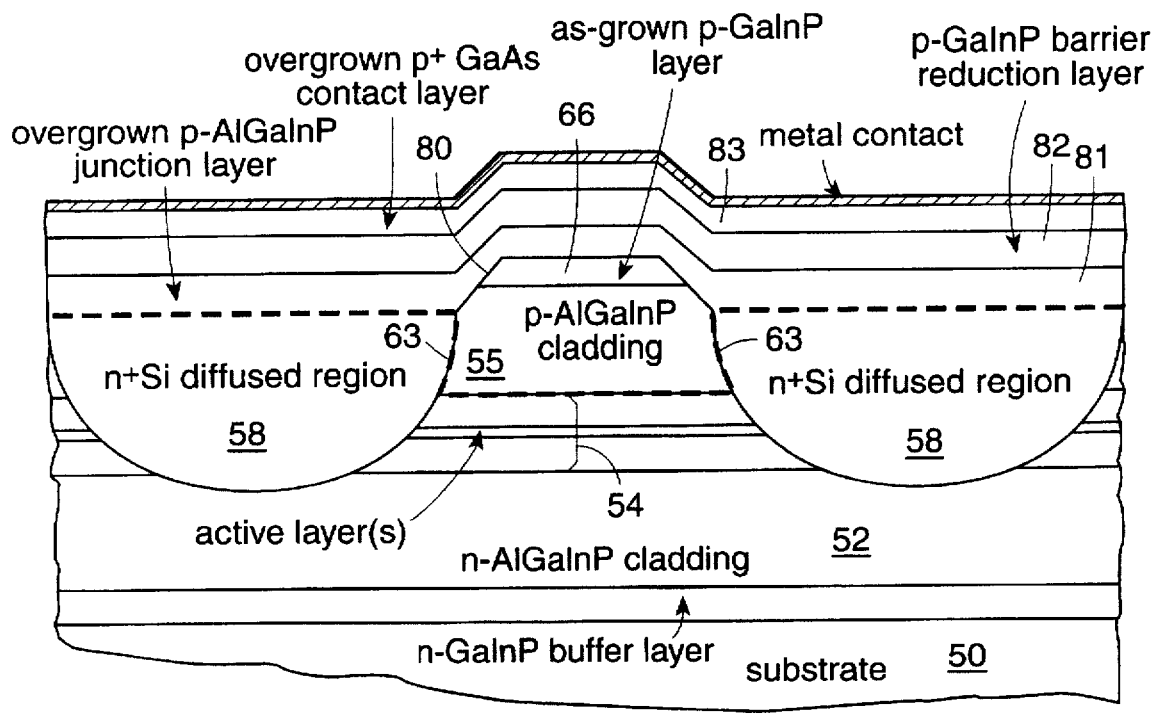
FIG. 8 is a schematic cross-section of a laser diode formed according to the invention.

Another approach to eliminating leakage through the junction between the p-GaInP and the disordered regions is shown in FIG. 8. After the optical waveguide has been formed by IILD, the $Si_3N_4/Si/Si_3N_4$ layers are removed and a shallow mesa is etched through the as-grown p-GaInP layer 66. It is possible that this etch can be performed with a remnant of the mask used to pattern the silicon diffusion. Otherwise a new mask is needed. Alternatively, an etching process that selectively attacks Al-containing material or n-doped material can be used to selectively remove material in the disordered regions and thereby produce the shallow mesa 80 containing the as-grown p-GaInP layer 66. After delineation of the mesa 80, a p-AlGaInP junction layer 81 followed by a p-GaInP barrier reduction layer 82 and a p-GaAs contact layer 83 are overgrown. The Al content of the junction layer 81 is chosen high enough to form a p-n heterojunction with the disordered regions 58 that has a higher turn-on voltage than the active layer. In order to minimize the additional forward voltage drop introduced by the presence of this layer in the conductive channel, it should be as thin as consistent with developing the p-n junction on the disordered regions. For this structure the as-grown p-GaInP layer 66 is kept thin, e.g., 4 or 5 nm, and functions as a protective layer to avoid oxidation of the AlGaInP within the current channel. Another benefit of a thin-GaInP layer 66 is that less GaInP increases the Al fraction at the surface of the disordered regions and thereby promotes etching of the disordered regions. Alternatively, if the native or enhanced oxide on the disordered regions 58 provides an adequate current block, the overgrowth may consist of only a p-GaInP layer followed by a p-GaAs contact layer 83. In this case the p-GaInP layer 82 adds to the as-grown p-GaInP layer 66 in the conductive channel to form the barrier reduction layer.

Figure 9:
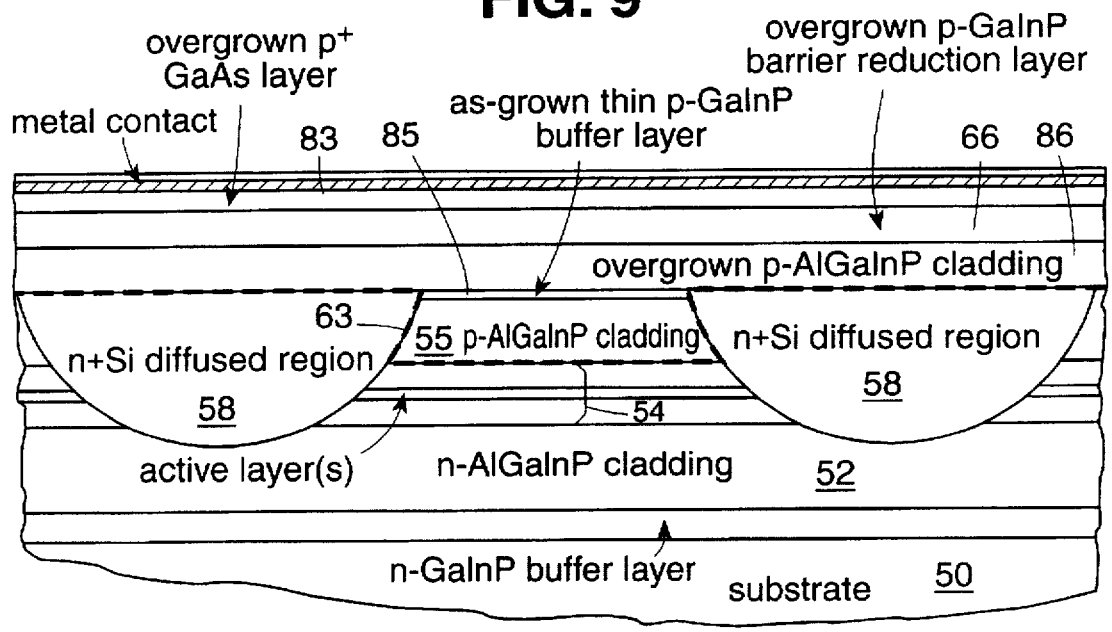
FIG. 9 is a schematic cross-section of a laser diode formed according to the invention.

FIG. 9 shows a preferred embodiment which does not have an etched mesa but eliminates the need for isolation on the disordered regions 58. In this case the buried optical waveguide is formed in a layer structure wherein the p-cladding 55 is grown thinner than needed for adequate optical confinement, e.g., 0.2 to 0.4 µm, and the p-GaInP buffer layer 85 is grown thin, e.g., 4 or 5 nm, to minimize leakage. After formation of the optical waveguide by IILD, a p-AlGaInP layer 86 is overgrown to form the remainder of the p-cladding layer, followed by a p-GaInP barrier reduction layer 66 and a p-GaAs contact layer 83. This structure has the advantage that the p-n junction 63 between the overgrown p-AlGaInP 86 and the disordered regions 58 has a higher turn-on voltage than the active layer. Thus no oxide or proton isolation is needed to block leakage through this interface. However leakage may still occur at the junction between the p-GaInP buffer layer 85 and the disordered region 58.

Figure 10:
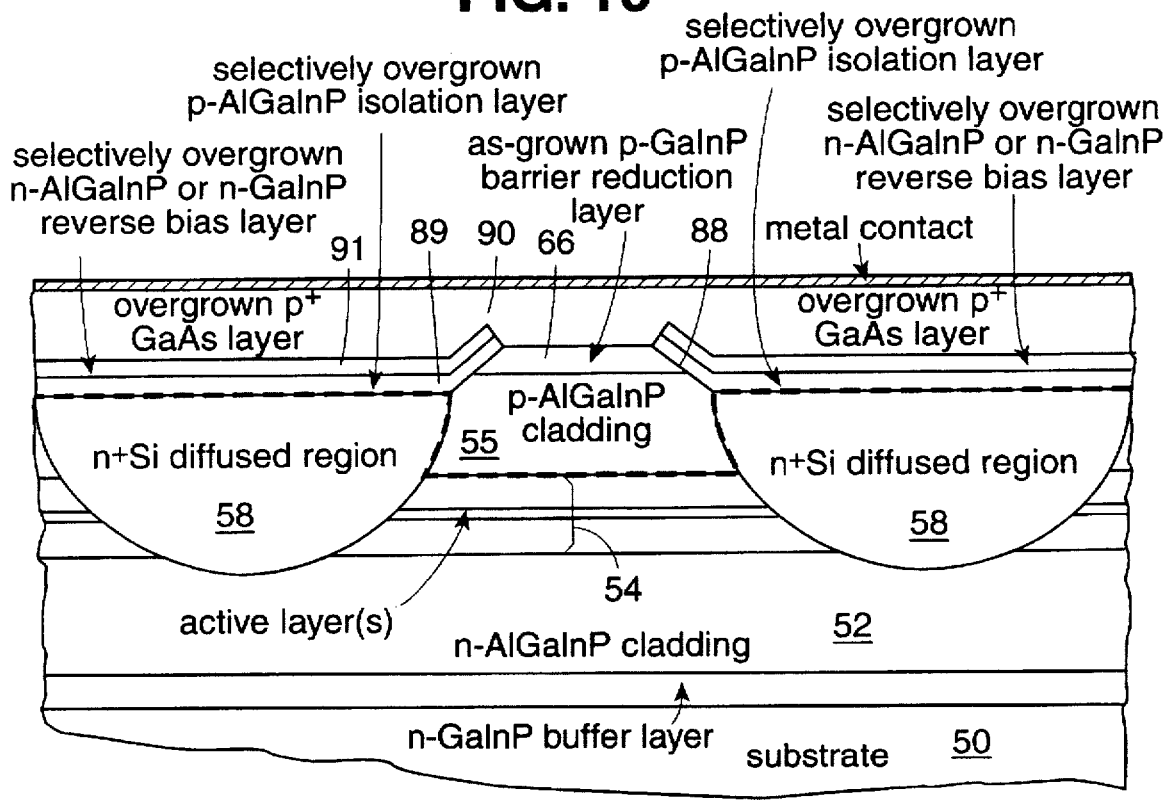
FIG. 10 is a schematic cross-section illustrating still another embodiment according to the invention.

A preferred embodiment to minimize leakage through all parasitic p-n junctions without increasing the operating voltage of the device is shown in FIG. 10. After formation of the buried optical waveguide, a shallow mesh 88 is etched through the p-GaInP barrier reduction layer 66 as described relative to FIG. 8. A p-AlGaInP isolation layer 89 is then grown over the wafer without removing the etching mask. Because of the mask, there is no growth above the mesa 88. After removal of the mask a p+ GaAs contact layer 90 is grown over the wafer forming a conductive channel above the optical waveguide. This structure essentially eliminates leakage through the disordered regions without an AlGaInP layer added to the conductive channel at the expense of a three stage growth process. Alternately, the growth of the p+ GaAs contact layer 90 can be eliminated by applying the metal contact directly to the p-GaInP barrier reduction layer 66. As was done in the FIG. 6 embodiment, a n-type reverse biased or junction layer 91 can alternatively be added to improve the isolation. As still a further alternative (not shown), a p-type junction layer can be selectively grown over the selectively overgrown n-type junction layer 91 to further improve the isolation, followed as shown in FIG. 10 with the overgrown contact layer 90.

As used herein, "barrier reduction layer" means a layer that functions to reduce the operating voltage in the conduction channel due to its decreased bandgap, and typically has a dopant concentration of $2\times10^{18}$–$6\times10^{18}$/cm$^3$, and a thickness of 100–500 nm. A "buffer layer" means a layer that functions to protect adjacent layers, and typically has a dopant concentration of $2\times10^{18}$–$8\times10^{18}$/cm$^3$, and a thickness of 100–500 nm. A "contact layer" means a layer that functions to provide a low resistance connection between the stripe channel and the top electrode, and typically has a dopant concentration of $1\times10^{19}$–$3\times10^{19}$/cm$^3$, and a thickness of 10–50 nm. An "isolation layer" means a layer functioning-to block carrier injection or transport, and typically has a dopant concentration of less than $10^{16}$/cm$^3$ and a thickness of 10–50 nm. A "junction layer" means a layer that functions to inject carriers across a p-n junction, and typically has a dopant concentration of $2\times10^{17}$–$1\times10^{18}$/cm$^3$, and a thickness of 100–500 nm. A "cladding" layer means a layer that functions to optically confine laser radiation, and typically has a dopant concentration of $2\times10^{18}$–$6\times10^{18}$/cm$^3$, a thickness of 500–1000 nm, a bandgap higher than and a refractive index lower than that of the active layer.

Figure 11:
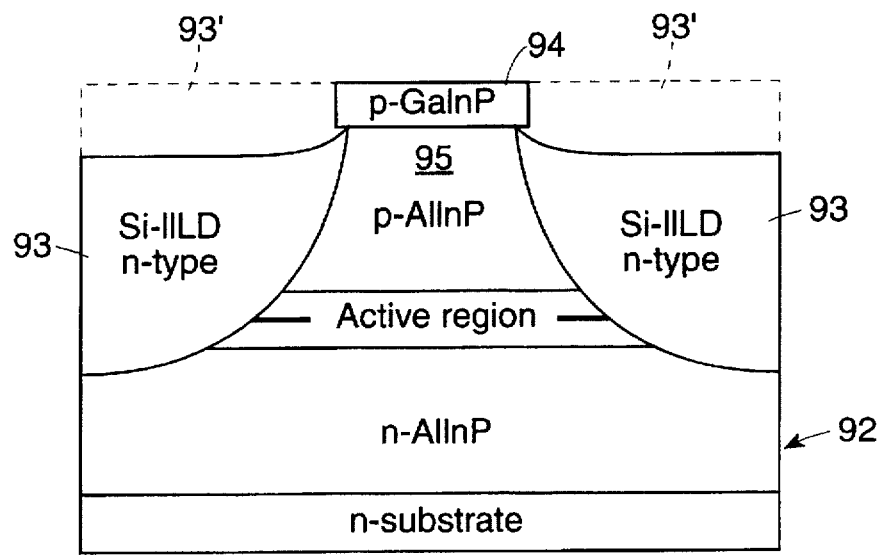
FIGS. 11, 12 and 13 are schematic cross-sections taken at a particular time in the fabrication of a device according to the invention.
Figure 12:
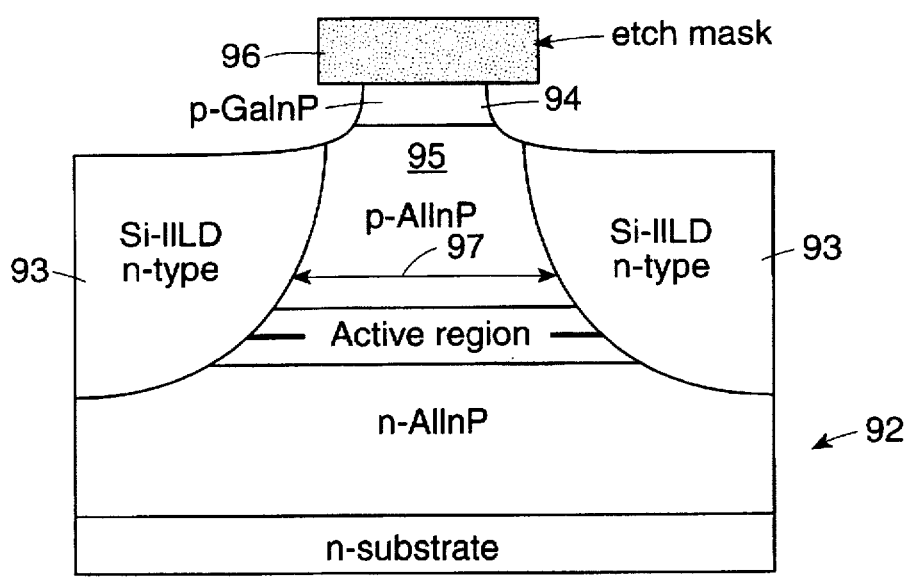
Figure 13:
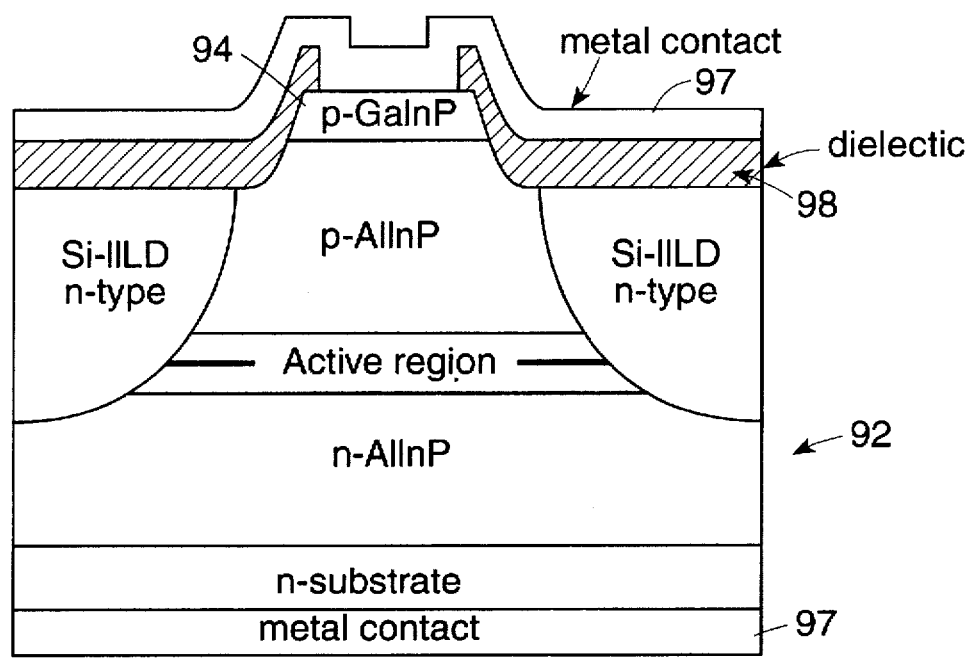

FIGS. 11–13 show additional embodiments according to the invention to reduce leakage current through the shunt junctions by removing the upper portions of the material outside the laser stripe.

An AlGaInP buried heterostructure laser 92 following impurity-induced layer disordering 93 of the active region is pictured in FIG. 11. The p-n junctions (not shown in FIG. 11 but shown in FIG. 2A) between the p-GaInP cap 94 and the n-disordered regions 93 on either side result in a leakage current which is shunted around the laser active region. Leakage at these junctions is more of a concern than along the junctions between the p-AlInP cladding 95 and the n-AlGaInP diffused regions 93 because the lower bandgap of the GaInP results in a lower turn-on voltage for the junction between the p-GaInP 94 and the n-diffused region 93.

The leakage at the upper junctions can be eliminated by removing the diffused material 93' to a shallow depth below the GaInP cap 94, as illustrated in FIG. 11. Since the GaInP layer is intermixed with the AlGaInP in the diffused regions 93, selective etch that will etch AlGaInP but not GaInP can be used to etch the diffused material in a self-aligned fashion, resulting in a structure like that shown in FIG. 11. An example of a suitable etch would be dilute HCL. Similarly, a dry selective etch could also be used. Alternatively, an etch which will remove n-type material but not p-type material could be used to etch the diffused regions in a self-aligned manner, also yielding a structure as shown in FIG. 11. Photo-electrochemical etching could be used as the doping type-selective etchant.

As an alternative to selective etchants, a wider mask 96 could be used along with wet chemical or dry etching following the IILD step to remove the necessary material, as depicted in FIG. 12. In this case, it is only necessary to etch a groove on each side of the stripe 97 to separate the p-GaInP 94 from the diffused regions.

Following the shallow etching step, any masking material is removed, and metal contacts 97 as shown in FIG. 13 are formed on the top of the structure and on the substrate. A blanket diffusion of a p-dopant species on the p-side prior to metallization could optionally be used to improve the contact there. If desired, prior to metallization, an insulating material 98 could be deposited over the top of the structure, and a window opened along the GaInP stripe 94. Alternatively, implanted or oxidized regions can be formed adjacent to or below the contact region 94.

For further details on the layer disordering process, reference is made to the referenced related applications, and the references listed in the Appendix, whose contents are herein incorporated by reference. These documents also describe conventional ways of growing the epitaxial structures, and conventional ways of masking and etching such structures. Moreover it will also be evident that the methods of the invention can be employed in the fabrication of side-by-side lasers in a common semiconductor body to form laser arrays for multi-color printing and other applications.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An index-guided semiconductor laser comprising:
   (a) a structure comprising a substrate, over the substrate an as-grown lower cladding layer of a first conductivity type, over the lower cladding layer an as-grown active region, over the active region an as-grown upper cladding layer of a second conductivity type, over the upper cladding layer an as-grown further layer of said second conductivity type, and
   (b) disordered regions of said first conductivity type flanking a stripe region of the structure, and
   (c) said disordered regions forming with the further layer an interface, in a direction transverse to the layer, that does not exceed 10 nm.

2. The laser of claim 1, wherein the cladding and further layers comprise a III-V material containing phosphorus.

3. The laser of claim 2, wherein the further layer comprises GaInP.

4. The laser of claim 1, wherein a grown barrier reduction layer is over the stripe region and disordered regions.

5. The laser of claim 4, wherein a grown contact layer is over the barrier reduction layer.

6. The laser of claim 5, wherein a grown or deposited isolation layer is over the disordered regions but not the stripe region.

7. The laser of claim 1, wherein a grown cladding layer overlies the further layer and disordered regions, a barrier reduction layer overlies the cladding layer, a contact layer overlies the barrier reduction layer.

8. The laser of claim 1, wherein the structure has a generally planar surface.

9. The laser of claim 1, wherein the further layer and part of the upper cladding layer are in a mesa, a grown first junction layer of said second type conductivity overlies just the disordered regions, a grown second junction layer of said first type conductivity overlies just the first junction layer.

10. The laser of claim 9, wherein a grown contact layer overlies the second junction layer and further layer.

11. An index-guided semiconductor laser comprising:
    (a) a structure comprising a substrate, over the substrate an as-grown lower cladding layer of a first conductivity type, over the lower cladding layer an as-grown active region, over the active region an as-grown upper cladding layer of a second conductivity type, over the upper cladding layer an as-grown further layer of said second conductivity type, and
    (b) disordered regions of said first conductivity type flanking a stripe region of the structure,
    (c) said disordered regions terminating below the further layer and forming no interface with the further layer; and
    (d) said further layer is not larger than 10 nm in a direction transverse to the layer.

12. The laser of claim 11, wherein the region above the disordered regions and forming an interface with the further layer comprises an insulating region.

13. The laser of claim 12, wherein the insulating region is proton-implanted.

14. The laser of claim 12, wherein the insulating region is an oxide region.

15. The laser of claim 11, wherein the further layer and part of the upper cladding layer are in a mesa, a grown junction layer overlies the further layer and disordered regions, a grown barrier reduction layer overlies the junction layer, a grown contact layer overlies the barrier reduction layer.

16. The laser of claim 11, wherein the further layer and part of the upper cladding layer are in a mesa, a grown p-n junction layer overlies just the disordered regions.

17. The laser of claim 16, wherein a grown contact layer overlies the junction layer and further layer.

18. The laser of claim 11, wherein the cladding and further layers comprise a III-V material containing phosphorus.

19. The laser of claim 11, wherein the further layer comprises GaInP.

20. The laser of claim 11, wherein said laser is an impurity-induced layer disordered (IILD) laser.

21. The laser of claim 11 wherein the disordered regions are disordered by silicon diffusion.

22. An index-guided semiconductor laser comprising:
    (a) a structure comprising a substrate, over the substrate an as-grown lower cladding layer of a first conductivity type, over the lower cladding layer an as-grown active region, over the active region an as-grown upper cladding layer of a second conductivity type, over the upper cladding layer an as-grown further layer of said second conductivity type, and
    (b) insulating regions flanking a stripe region of the structure, said insulating regions extending down to below the active region, wherein said laser is an impurity-induced layer disordered (IILD) laser, said insulating regions are disordered before they are made insulating and the cladding and further layers comprise a III-V material containing phosphorus.

23. The laser of claim 22, wherein said insulating regions form an interface with the further layer.

24. The laser of claim 22, wherein said insulating regions are semiconductor regions which have been oxidized.

25. The laser of claim 22, wherein the further layer comprises GaInP.

* * * * *